United States Patent
Tilove et al.

(10) Patent No.: US 8,831,921 B2
(45) Date of Patent: Sep. 9, 2014

(54) FLUID ACCESS AND DRAINAGE ASSESSMENT

(75) Inventors: Robert Bruce Tilove, Rochester Hills, MI (US); Narahari K. Hunsur, Karnataka (IN)

(73) Assignee: GM Global Technology Corporation, Detroit, MI (US)

( * ) Notice: Subject to any disclaimer, the term of this patent is extended or adjusted under 35 U.S.C. 154(b) by 621 days.

(21) Appl. No.: 13/092,181

(22) Filed: Apr. 22, 2011

(65) Prior Publication Data
US 2012/0271607 A1    Oct. 25, 2012

(51) Int. Cl.
*G06G 7/48*    (2006.01)
*G06G 7/57*    (2006.01)
*G06F 17/50*   (2006.01)

(52) U.S. Cl.
CPC .................................. *G06F 17/5095* (2013.01)
USPC ........................................ 703/7; 703/1; 703/9

(58) Field of Classification Search
None
See application file for complete search history.

(56) References Cited

PUBLICATIONS

American Galvanizers Association, "The Design of Products to be Hot-Dip Galvanized After Fabrication", 2000, 25 pages.*
Askeland et al., "Fast Exact Convex and Concave Curvature in Digital Topography", 2009, 11 pages.*
LMNO Engineering, Research, and Software, "Time to Empty or Drain a Tank, Pond, Reservoir Containing Water or other Liquid", 2010, 4 pages.*

* cited by examiner

Primary Examiner — Suzanne Lo
(74) Attorney, Agent, or Firm — Quinn Law Group, PLLC

(57) ABSTRACT

A system includes a host application configured to receive a component model representing a vehicle component. The component model includes a body having a concave portion and/or a convex portion that defines a fluid retainer. A detection tool in communication with the host application is configured to determine a size and location of the fluid retainer. The detection tool is further configured to associate the size of the fluid retainer to a design rule and calculate a value representing a minimum hole size that will allow fluid to flow into or out of the fluid retainer in accordance with the design rule.

15 Claims, 2 Drawing Sheets

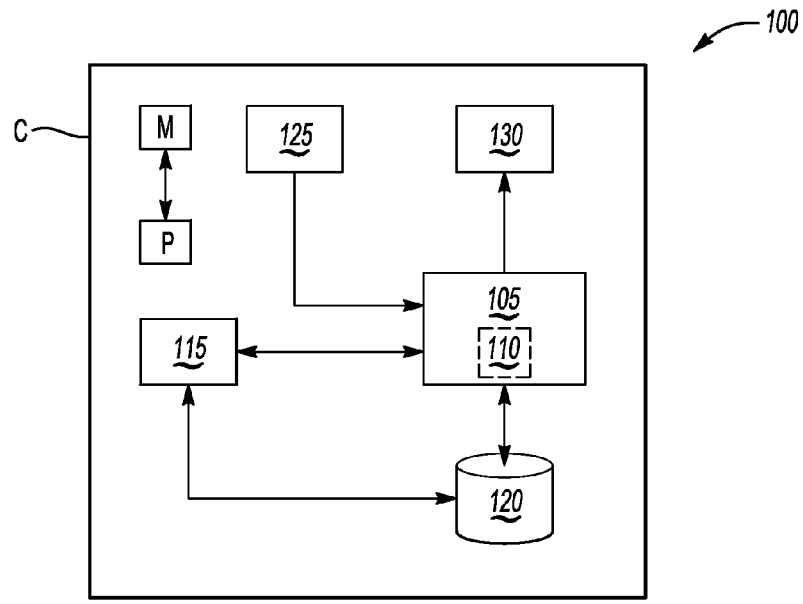
Fig-1
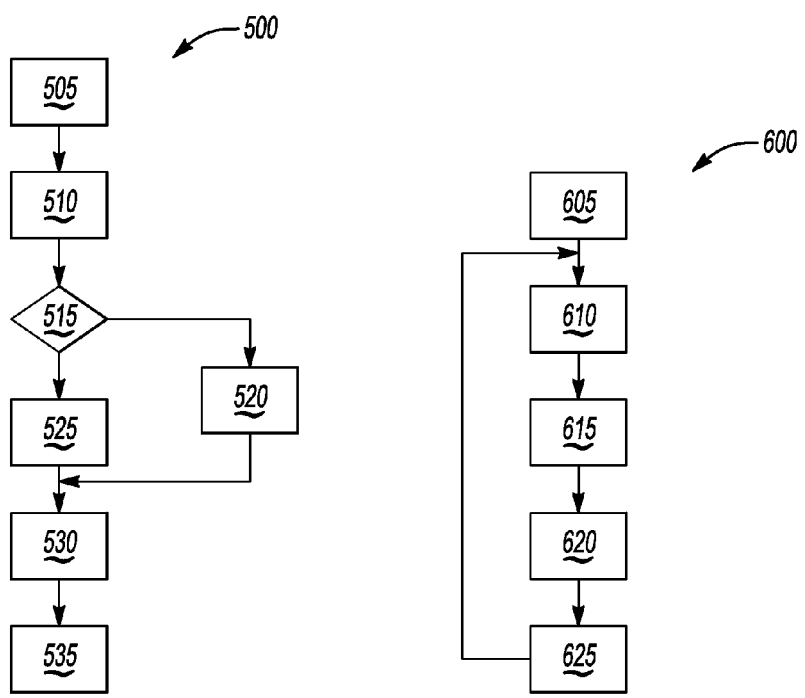
Fig-5
Fig-6

FLUID ACCESS AND DRAINAGE ASSESSMENT

TECHNICAL FIELD

The disclosure relates to a system and method for a fluid access and drainage assessment.

BACKGROUND

Vehicle components are often painted to improve the look of the vehicle to consumers. The paint process also helps prevent vehicle components from rusting. During the manufacturing process, one or more vehicle components may be dipped into a paint bath and placed onto a conveyor before entering a paint bake oven. The vehicle component may be suspended over the paint bath so that excess paint may drip into the paint bath before the vehicle component is loaded onto the conveyor. The conveyor may further collect excess paint that drips off of the vehicle component prior to entering the paint bake oven.

SUMMARY

A system includes a host application configured to receive a component model representing a vehicle component. The component model includes a body having a concave portion, a convex portion, or both that define one or more fluid retainers. A detection tool in communication with the host application is configured to determine a size and location of the fluid retainer. The detection tool is further configured to associate the size of the fluid retainer to a design rule and calculate a value representing a minimum hole size that will allow fluid to flow into or out of the fluid retainer in accordance with the design rule.

A method includes loading a component model including a body having at least one of a concave portion and a convex portion defining a fluid retainer into a host application and determining a size and location of the fluid retainer. The method further includes selecting a design rule associated with the size of the fluid retainer and calculating, via a detection tool, a value representing a minimum hole size that will allow fluid to flow into or out of the fluid retainer in accordance with the design rule.

The above features and the advantages of the present disclosure are readily apparent from the following detailed description of the best modes for carrying out the invention when taken in connection with the accompanying drawings.

BRIEF DESCRIPTION OF THE DRAWINGS

FIG. 1 is a schematic diagram of an example system having a detection tool configured to detect a location and size of fluid retainers defined by the component model representing a vehicle component.

FIG. 5 illustrates an example process that may be implemented by the system of FIG. 1.

FIG. 6 illustrates an example process that may be implemented by the detection tool of FIG. 1 to detect the location and size of one or more fluid retainers defined by a component model.

DETAILED DESCRIPTION

Figure 2:
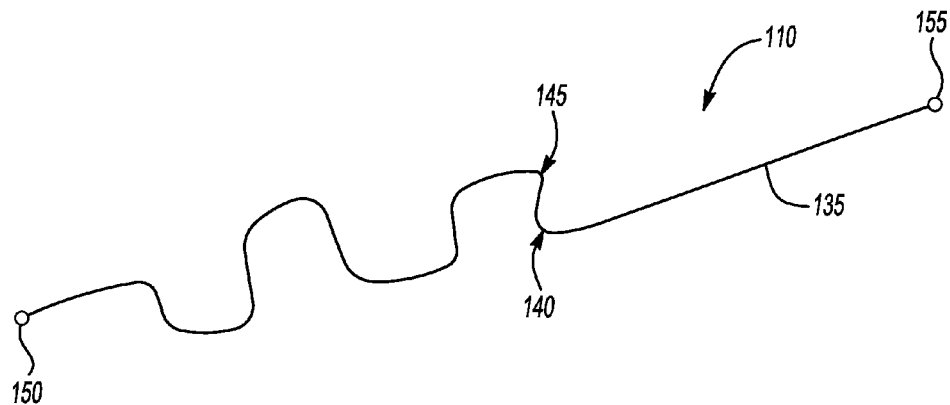
FIG. 2 is a schematic diagram of an example component model.

A system includes a detection tool that is configured to determine a size and location of fluid retainers defined by component models that represent vehicle components. The fluid retainer may trap a liquid, gas, or any other fluid during, for example, a manufacturing process of the vehicle component. The detection tool may be further configured to associate the size of the fluid retainer to a design rule and calculate a value representing a minimum hole size that will allow fluid to flow into or out of the fluid retainer in accordance with the design rule. This way, one or more holes may act as access or drainage holes that may vent a gas and/or allow a liquid to access pockets or drain from reservoirs defined by the surface of the vehicle component. Accordingly, the system may present the minimum hole size to the user so that the user, a host application, or the detection tool, may modify the component model to include access and/or drainage holes in accordance with the design rule so that, e.g., fluid can properly access and/or drain from the vehicle component during a manufacturing process, such as a paint process. While discussed in the context of vehicle components, the system may be used to design any product that may contact a fluid during the manufacturing process.

The system may take many different forms and include multiple and/or alternate components and facilities. While an example system is shown in the Figures, the components illustrated in the Figures are not intended to be limiting. Indeed, additional or alternative components and/or implementations may be used.

FIG. 1 illustrates an example computing system 100 that may include a host application 105, a component model 110, and a detection tool 115. The system 100 may be implemented by one or more computing devices (C) and may be in communication with any number of databases 120 storing information, as discussed in greater detail below.

In general, computing systems and/or devices such as the computing devices (C) may employ any of a number of computer operating systems and may include computer-executable instructions, where the instructions may be executable by the one or more computing devices (C) described above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (P) (e.g., a microprocessor) receives instructions, e.g., from a memory (M), a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

The host application 105 may tangibly embody executable instructions that allow a user to interact with the system 100 to, e.g., view and manipulate one or more of the component models 110. For example, the host application 105 may include executable instructions that load one or more component models 110, receive inputs from the user via an input device 125, and present a graphical representation of one or more of the component models 110 to the user via a display device 130. Additionally, the host application 105 may be configured to receive and/or transmit information to other applications that may be used in the system 100. Moreover, the host application 105 may tangibly embody executable instructions that allow other applications to manipulate one or more component models presented.

The component model 110 may include any electronic representation of a vehicle component. In one example approach, the component model 110 may represent the vehicle component as a two-dimensional line drawing. Alternatively, the component model 110 may represent the vehicle component as a three-dimensional line drawing or as three-dimensional objects. The component model 110 may be manipulated based on inputs provided to the host application 105 from the user or from another application. The component models 110 may be stored in one or more databases 120 that are accessible to the host application 105 either locally or via a network. Example component models 110 are described in greater detail below with respect to FIGS. 2-4.

The detection tool 115 may be configured to analyze the component model 110 loaded into the host application 105 to provide fluid access and drainage information about the vehicle component. Such information may be useful during the manufacturing process, including a paint process, of the vehicle component. For example, the detection tool 115 may be configured to detect the location of fluid retainers, such as reservoirs or pockets, that may affect the flow of fluid during the manufacturing process. Reservoirs, for instance, may allow paint to collect on the vehicle component during the paint process. Pockets, on the other hand, may prevent paint from fully accessing the surface of the vehicle component. The detection tool 115 may be further configured to determine the size, such as area and/or volume, and location of the fluid retainers identified.

Once identified, the detection tool 115 may suggest remedies to facilitate the flow of fluid, such as a liquid or gas, during the manufacturing process despite the fluid retainers. One remedy may include suggesting that one or more access and/or drainage holes be strategically placed in each of the fluid retainers. The detection tool 115 may be configured to calculate a value representing a minimum hole size for each fluid retainer needed to allow the fluid to flow into (e.g., access) and/or flow out of (e.g., vent or drain from) the fluid retainer during the manufacturing process, and output the value to the display device 130 either directly or via the host application 105. Moreover, the detection tool 115 may be configured to output a suggested number, size, and/or location of access holes, drainage holes, or both, that would facilitate, e.g., the fastest access to and/or drainage from the fluid retainer.

The value for the minimum hole size may be derived from a design rule. In one possible approach, the design rule may define an amount of time available for the fluid to properly access and/or drain from the vehicle component during the manufacturing process. One design rule, for instance, may define the amount of time that is available for fluid to access the fluid retainer when, e.g., the vehicle component is lowered into the paint bath while another design rule may define the amount of time that is available for fluid to drain from the fluid retainer when, e.g., the vehicle component is removed from the paint bath. Each design rule may be stored in one or more databases 120, and the detection tool 115 may be configured to access the design rule from one or more of the databases 120. The design tool may be configured to output the value calculated to the display device 130 via, e.g., the host application 105.

Another remedy may include suggesting alternative orientations of the vehicle component in the manufacturing process. For instance, the detection tool 115 may be configured to determine that fewer access and/or drain holes may be needed if the vehicle component were oriented differently when placed into and/or removed from the paint bath. If so, the detection tool 115 may output these suggested alternative orientations for consideration by the user.

The database 120 may include any number of data repositories or other data stores using one or more mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

FIG. 2 is a schematic diagram of an example component model 110 that may graphically represent one or more vehicle components. For instance, the component model 110 may be a two-dimensional or three-dimensional representation of the vehicle component. For purposes of clarity, FIG. 2 illustrates a two-dimensional component model 110. Although not illustrated, the concepts described below may further apply to detecting fluid retainers of three-dimensional component models as well.

The component model 110 includes a body 135 that may represent one or more surfaces of the vehicle component that come into contact with a fluid during, e.g., the manufacturing process. As illustrated, the body 135 defines concave portions 140, convex portions 145, a first endpoint 150, and a second endpoint 155. The body 135 may have other features or shapes than shown.

The concave portions 140 may define reservoirs that could retain fluid when, e.g., the vehicle component is removed from a paint bath. The convex portions 145 may define pockets that could prevent fluid from accessing one or more surfaces of the vehicle component when, e.g., the vehicle component is lowered into a paint bath. Each of the concave portions 140 and the convex portions 145 include an inflection point (see FIGS. 3 and 4) representing, e.g., a peak of the convex portion 145 or the lowest point of the concave portion 140. As discussed in greater detail below, the detection tool 115 may be configured to identify reservoirs using the inflection points of the convex portions 145 and pockets using the inflection points of the concave portions 140.

The first endpoint 150 and the second endpoint 155 may each represent the terminal ends of one or more surfaces of the vehicle component. In the example component model 110 of FIG. 2, the first endpoint 150 and the second endpoint 155 each represent a terminal end of the body 135. The component model 110, however, may have any number of endpoints, including zero end points.

Figure 3:
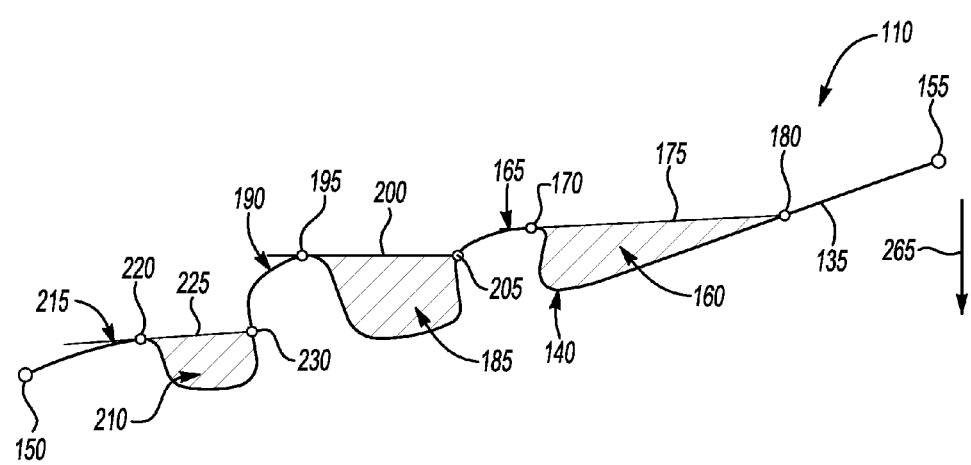
FIG. 3 is a schematic diagram of the example component model of FIG. 2 with detected reservoirs.

Referring now to FIG. 3, the detection tool 115 may be configured to define one or more of the fluid retainers as reservoirs based on the physical features of the vehicle component represented by the component model 110. In one example implementation, the detection tool 115 may identify reservoirs based on the convex portions 145 of the body 135. In the component model 110 illustrated in FIG. 3, the detection tool 115 may identify a first reservoir 160 from a first convex portion 165, a first inflection point 170, a first test surface 175, and a first intersection point 180.

The detection tool 115 may identify the first convex portion 165 from a portion of the body 135 that is adjacent to the first reservoir 160 and that would capture a fluid such as air when, e.g., the vehicle component moves with the direction of gravity 265. The detection tool 115 may identify the first inflection point 170 as the peak of the first convex portion 165. The detection tool 115 may generate the first test surface 175 to extend through the first inflection point 170 in a direction that is substantially perpendicular to the direction of gravity 265. The detection tool 115 may identify the first intersection point 180 as the closest intersection of the test surface and the body 135. The detection tool 115 may define the first reservoir 160 as the concave portion 140 of the body 135 that is disposed between the first inflection point 170 and the first intersection point 180. The detection tool 115 may further calculate the size of the first reservoir 160 based on the area and/or volume of a space between the first reservoir 160 and the first test surface 175.

In the example component model 110 of FIG. 3, the detection tool 115 may apply a similar technique to identify a second reservoir 185 from a second convex portion 190, a second inflection point 195, a second test surface 200, and a second intersection point 205 and a third reservoir 210 from a third convex portion 215, a third inflection point 220, a third test surface 225, and a third intersection point 230. Moreover, the detection tool 115 may detect the sizes of the second and third reservoirs 185, 210 based on the area and/or volume of a space defined between the second reservoir 185 and the second test surface 200 and the third reservoir 210 and the third test surface 225.

Figure 4:
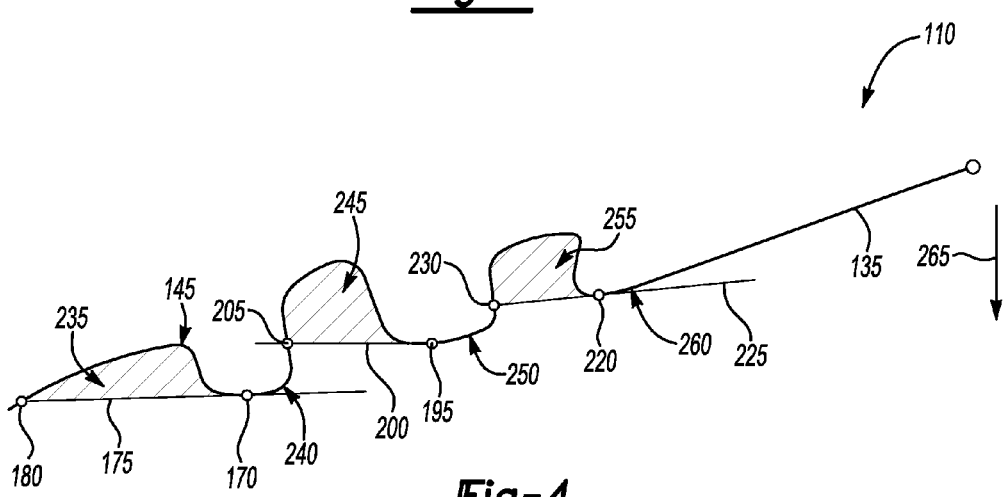
FIG. 4 is a schematic diagram of the example component model of FIG. 2 with detected pockets.

With reference to FIG. 4, the detection tool 115 may be configured to define one or more of the fluid retainers as pockets based on the physical features of the vehicle component represented by the component model 110. In one example implementation, the detection tool 115 may identify pockets based on the concave portions 140 of the body 135. In the component model 110 illustrated in FIG. 4, the detection tool 115 may identify a first pocket 235 from a first concave portion 240, a first inflection point 170, a first test surface 175, and a first intersection point 180.

The detection tool 115 may identify the first concave portion 240 from a portion of the body 135 that is adjacent to the first pocket 235 and that would hold a fluid such as a liquid when, e.g., the vehicle component moves against the direction of gravity 265. Such motion may occur when, e.g., the vehicle component is removed from a paint bath. The detection tool 115 may identify the first inflection point 170 as the lowest point of the first concave portion 240. The detection tool 115 may generate the first test surface 175 to extend through the first inflection point 170 in a direction that is substantially perpendicular to the direction of gravity 265. The detection tool 115 may identify the first intersection point 180 as the closest intersection of the test surface and the body 135. The detection tool 115 may define the first pocket 235 as the convex portion 145 of the body 135 that is disposed between the first inflection point 170 and the first intersection point 180. The detection tool 115 may further calculate the size of the first pocket 235 based on the area and/or volume of a space between the first pocket 235 and the first test surface 175.

In the example component model 110 of FIG. 4, the detection tool 115 may apply a similar technique to identify a second pocket 245 from a second concave portion 250, a second inflection point 195, a second test surface 200, and a second intersection point 205. Furthermore, the detection tool 115 may apply a similar technique to identify a third pocket 255 from a third concave portion 260, a third inflection point 220, a third test surface 225, and a third intersection point 230. Moreover, the detection tool 115 may detect the sizes of the second and third pockets 245, 255 based on the area and/or volume of a space defined between the second pocket 245 and the second test surface 200 and a space between the third pocket 255 and the third test surface 225, respectively.

Although the component models 110 of FIGS. 2-4 are illustrated as two-dimensional drawings, the detection tool 115 may take a similar approach to determine the size and location of fluid reservoirs using a three-dimensional representation of the vehicle component.

FIG. 5 illustrates a flowchart of an example process 500 that may be implemented by the system 100 of FIG. 1. The process 500 may be used to, e.g., help the user design vehicle components in a way that allows fluid to properly access and/or drain from fluid retainers defined by the vehicle component during the manufacturing process.

At block 505, the system 100 may load the component model 110 into the host application 105. For instance, the host application 105 may access one or more component models 110 from the database 120 and present the component model 110 to the user via, e.g., the display device 130.

At block 510, the detection tool 115 may determine the size and location of each fluid retainer, such as pockets and/or reservoirs, defined by the component model 110 loaded into the host application 105 at block 505. For instance, the detection tool 115 may identify the inflection point of each concave and/or convex portion 140, 145 in the component model 110, generate a test surface that extends through each inflection point to identify one or more intersection points, and define the fluid retainer as the concave and/or convex portions 140, 145 of the body 135 of the component model 110 between the intersection point and the inflection point. Moreover, the detection tool 115 may determine the size of the fluid retainer based on an area and/or volume of the space between the test surface and the pocket and/or reservoir detected.

At decision block 515, the detection tool 115 may determine whether the fluid retainer is a pocket defined by a convex portion 145 of the component model 110 or a reservoir defined by a concave portion 140 of the component model 110. If the fluid retainer is a reservoir, the process 500 may continue at block 520. If, however, the fluid retainer is a pocket, the process 500 may continue at block 525.

At block 520, the detection tool 115 may define the fluid retainer as a reservoir that will collect fluid when, e.g., the vehicle component is removed from a paint bath. Accordingly, the detection tool 115 may select a design rule associated with the amount of time available during manufacturing process for the reservoir to drain. For example, the design rule may designate the amount of time that the vehicle component may be suspended over the paint bath or placed on a conveyor belt before entering a paint bake oven.

At block 525, the detection tool 115 may define the fluid retainer as a pocket that will prevent a fluid, such as a liquid or gas, from accessing or venting from the convex portion 145 of the vehicle component when, e.g., the vehicle component is dipped in the paint bath. Therefore, the detection tool 115 may select a design rule associated with the amount of time that is available for paint to access the pocket when, e.g., the vehicle component is lowered into the paint bath.

At block 530, the detection tool 115 may calculate a value representing the minimum hole size for each fluid retainer that is needed for the fluid to flow into the pockets or out of the reservoirs in accordance with the time designated by the design rule. Depending on the size of the fluid retainer, the detection tool 115 may determine a suggested number, size, and/or location of access holes, drainage holes, or both, that would facilitate access to and/or drainage from the fluid retainer given the design rule.

At block 535, the host application 105 may present the value calculated at block 530 to the user so, for example, the user may make one or more selections to control the way that the component model 110 is modified to implement the holes suggested by the detection tool 115. In one example approach, the host application 105 may prompt the user with suggestions for modifying the component model 110 to include the suggested access and/or drainage holes. That is, the host application 105 may request that the user select whether to manually modify the component model 110 or to allow the host application 105 and/or detection tool 115 to automatically modify the component model 110. This way, either the user or the detection tool 115 may select the number of access and/or drainage holes, as well as the size and location of each hole, to include in the component model 110. Additionally, the user, the detection tool 115, and/or the host application 105 may manipulate the component model 110 to include the access and/or drainage holes.

FIG. 6 illustrates an example process 600 that may be implemented by the detection tool 115 of FIG. 1 to, e.g., detect the location and size of one or more of the fluid retainers. For instance, the process 600 may be used to identify the first reservoir 160, the second reservoir 185, the third reservoir 210, the first pocket 235, the second pocket 245, and/or the third pocket 255.

At block 605, the detection tool 115 may identify the endpoints of the component model 110 and select one of the endpoints as a reference point. For example, the detection tool 115 may identify the endpoint that would enter the paint bath first as the reference point. As illustrated above in FIGS. 2-4, the first endpoint 150 may be selected as the reference point.

At block 610, the detection tool 115 may identify the inflection point of each concave and/or convex portion 140, 145 of the component model 110. As discussed above, the concave portions 140 may be used to determine the location of one or more pockets defined by the convex portions 145, and the convex portions 145 may be used to determine the location of one or more reservoirs defined by the concave portions 140. In one possible approach, the detection tool 115 may identify one or more inflection points of the concave portions 140 before identifying one or more of the inflection points of the convex portions 145, or vice versa. Alternatively, the detection tool 115 may identify the inflection points of the concave portions 140 and the convex portions 145 simultaneously.

At block 615, the detection tool 115 may generate one or more test surfaces. The detection tool 115 may generate each test surface to extend through one of the inflection points in a direction that is perpendicular to the direction of gravity 265.

At block 620, the detection tool 115 may identify one or more intersection points using the test surfaces. That is, the detection tool 115 may identify the closest point where the test surface intersects the body 135 as the intersection point. As discussed above, the detection tool 115 may define each fluid retainer as the concave and/or convex portion 140, 145 of the component model 110 between the intersection point and the inflection point.

At block 625, the detection tool 115 may calculate the size and location of each fluid retainer detected. That is, the detection tool 115 may determine a volume or area of the space bound by the fluid retainer and the test surface.

After block 625, the process 600 may return to block 610 so, e.g., the detection tool 115 may detect other fluid retainers defined by the component model 110. For example, the detection tool 115 may detect one fluid retainer for each iteration of the process 600. When detecting reservoirs, the detection tool 115 may begin with the inflection point that is, e.g., furthest from the reference point of block 605. For the next iteration, the detection tool 115 may identify the next furthest inflection point. When detecting pockets, the detection tool 115 may begin with the inflection point that is, e.g., closest to the reference point of block 605. At the next iteration of the process 600, the detection tool 115 may identify the next closest inflection point. Therefore, for each iteration of the process 600, the detection tool 115 may continue with the next inflection point, test surface, and intersection point relative to the reference point determined at block 605.

While the best modes for carrying out the invention have been described in detail, those familiar with the art to which this invention relates will recognize various alternative designs and embodiments for practicing the invention within the scope of the appended claims.

The invention claimed is:

1. A method comprising:
loading a component model into a host application of a computer device, wherein the component model represents a vehicle component having a body with at least one of a concave portion and a convex portion defining a fluid retainer, and wherein the computer device includes a processor and a detection tool;
determining, via the processor, a size and location of the fluid retainer using the detection tool;
selecting a design rule associated with the size of the fluid retainer;
calculating, via the detection tool using the processor, a value representing a minimum hole size that will allow fluid to flow into or out of the fluid retainer in accordance with the design rule; and
automatically modifying the component model via one of the host application and the detection tool, using the processor, in response to the calculated value.

2. A method as set forth in claim 1, wherein determining the size and location of the fluid retainer includes identifying an inflection point of at least one of the concave portion and the convex portion.

3. A method as set forth in claim 2, wherein determining the size and location of the fluid retainer includes generating a test surface that extends through the inflection point and that intersects the body at an intersection point.

4. A method as set forth in claim 3, further comprising defining the fluid retainer as a reservoir if the concave portion is disposed between the inflection point and the intersection point.

5. A method as set forth in claim 3, further comprising defining the fluid retainer as a pocket if the convex portion is disposed between the inflection point and the intersection point.

6. A method as set forth in claim 3, wherein determining the size and location of the fluid retainer includes determining the size of the fluid retainer based on an area or volume of a space bound by the inflection point, the intersection point, the test surface, and at least one of the concave portion and the convex portion of the body.

7. A method comprising:
  receiving a component model into a host application of a computer device having a processor, tangible, non-transitory memory, and a detection tool, wherein the component model represents a body of vehicle having at least one of a concave portion and a convex portion that define a fluid retainer;
  determining, via the detection tool of the computer device using the processor, a size and location of the defined fluid retainer;
  associating, via the detection tool, the size of the fluid retainer with a design rule;
  calculating, via the detection tool, a value representing a minimum hole size that will allow fluid to flow into or out of the fluid retainer in accordance with the design rule; and
  automatically modifying the component model via one of the host application and the detection tool, using the processor, in response to the calculated value.

8. A method as set forth in claim 7, further comprising identifying an inflection point of at least one of the concave portion and the convex portion via the detection tool and the processor.

9. A method as set forth in claim 7, further comprising generating a test surface, via the detection tool and the processor, that extends through the inflection point and that intersects the body at an intersection point.

10. A method as set forth in claim 9, further comprising defining the fluid retainer, via the detection tool and the processor, as a reservoir if the concave portion is disposed between the inflection point and the intersection point.

11. A method as set forth in claim 9, further comprising defining the fluid retainer, via the detection tool and the processor, as a pocket if the convex portion is disposed between the inflection point and the intersection point.

12. A method as set forth in claim 9, further comprising determining, via the detection tool and the processor, the size of the fluid retainer based on an area or volume of a space bound by the inflection point, the intersection point, the test surface, and at least one of the concave portion and the convex portion of the body.

13. A method as set forth in claim 9, further comprising generating, via the detection tool and the processor, the test surface to extend in a direction perpendicular to a direction of gravity.

14. A method as set forth in claim 7, further comprising displaying a value representing the minimum hole size to a display device.

15. A method as set forth in claim 7, wherein the design rule designates an amount of time available for paint to access the vehicle component or drain from the vehicle component during a paint procedure.

* * * * *